United States Patent
Khazanov et al.

(10) Patent No.: US 6,569,294 B1
(45) Date of Patent: *May 27, 2003

(54) SPUTTERING TARGET ASSEMBLY AND METHOD FOR DEPOSITING A THICKNESS GRADIENT LAYER WITH NARROW TRANSITION ZONE

(75) Inventors: Alexander Boris Khazanov, Mountain View, CA (US); Shanghsien Rou, Fremont, CA (US); Jie-Ming Yu, Pleasanton, CA (US); Paul Stephen McLeod, Berkeley, CA (US); Mark Anthony Shows, Austin, TX (US); Kuo-Hsing Hwang, San Jose, CA (US); Chung-Yuang Shih, Cupertino, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/884,482

(22) Filed: Jun. 20, 2001

(Under 37 CFR 1.47)

Related U.S. Application Data (63) Continuation-in-part of application No. 09/615,317, filed on Jul. 13, 2000, now Pat. No. 6,468,405
(60) Provisional application No. 60/144,651, filed on Jul. 15, 1999.

(51) Int. Cl.[7] ........................... C23C 14/34; C23C 14/35
(52) U.S. Cl. ........................ 204/192.16; 204/192.12; 204/192.15; 204/298.11; 204/298.13
(58) Field of Search ................... 204/192.12, 192.15, 204/192.16, 298.11, 298.13, 298.19

(56) References Cited

U.S. PATENT DOCUMENTS

| | | | | |
|---|---|---|---|---|
| 5,366,607 A | * | 11/1994 | Lal et al. | 204/298.19 |
| 5,512,150 A | | 4/1996 | Bourez et al. | 204/192.2 |
| 5,520,981 A | | 5/1996 | Yang et al. | 428/65.5 |
| 5,558,749 A | * | 9/1996 | Yokoyama et al. | 204/192.12 |
| 5,670,030 A | | 9/1997 | Solberg et al. | 204/192.26 |
| 5,736,020 A | | 4/1998 | Lal et al. | 204/298.11 |
| 5,736,021 A | | 4/1998 | Ding et al. | 204/298.11 |
| 5,800,687 A | | 9/1998 | Kempf | 204/298.11 |
| 5,824,197 A | | 10/1998 | Tanaka | 204/192.12 |
| 5,879,523 A | | 3/1999 | Wang et al. | 204/298.11 |
| 5,922,133 A | | 7/1999 | Tepman et al. | 118/720 |
| 5,922,176 A | | 7/1999 | Caskey | 204/192.12 |
| 5,944,967 A | | 8/1999 | Kunz et al. | 204/298.11 |

FOREIGN PATENT DOCUMENTS

| GB | 2110719 A | * | 6/1993 | C23C/15/00 |
|---|---|---|---|---|

* cited by examiner

*Primary Examiner*—Steven H. VerSteeg
(74) *Attorney, Agent, or Firm*—McDermott, Will & Emery (57) ABSTRACT

Selective deposition of a layer of a material, such as a thick protective overcoat, onto a selected substrate area, such as the inner or CSS landing zone, is achieved using a sputtering target assembly comprising a target/cathode having a planar sputtering surface including an erosion track area, a collimating shield positioned proximate the sputtering surface and surrounding at least a portion of the erosion track area, the collimating shield including an inwardly facing wall, and a blocking shield centrally positioned over the surface of the target/cathode and including an outwardly facing wall, wherein the inwardly facing wall of the collimating shield and the outwardly facing wall, wherein the inwardly facing wall of the collimating shield and the outwardly facing wall of the central blocking shield form an open-ended collimating channel for directing sputtered particles onto the selected substrate area.

19 Claims, 3 Drawing Sheets

SPUTTERING TARGET ASSEMBLY AND METHOD FOR DEPOSITING A THICKNESS GRADIENT LAYER WITH NARROW TRANSITION ZONE

CROSS-REFERENCE TO PRIORITY APPLICATIONS

This application is a Continuation-in-Part of application Ser. No. 09/615,317, filed Jul. 13, 2000, now U.S. Pat. No. 6,468,405 which application claims priority from provisional patent application Serial No. 60/144,651 filed Jul. 15, 1999, the entire disclosure of which is incorporated herein by reference.

FIELD OF THE INVENTION

The present invention relates to a target assembly and its method of use in depositing a layer of material having relatively thin and relatively thick portions adjacent to each other, with a very narrow transition region therebetween. More particularly, the present invention relates to an apparatus and method useful in forming a protective overcoat on a magnetic recording/information storage/read-out disk, wherein the thickness of the overcoat layer in an annularly-shaped inner landing, or CSS, zone of the disk is greater than the thickness of the overcoat layer in an outer, data zone of the disk. The present invention also relates to the formation of coatings, such as optical, anti-friction, wear or corrosion-resistant coatings, which require variation of the properties thereof in a radial direction.

BACKGROUND OF THE INVENTION

Magnetic recording media typically require an overcoat for wear and corrosion protection, inasmuch as contact start/stop (CSS) failures in hard disk drives can result in unrecoverable data loss. As a consequence, good tribological performance is one of the most stringent requirements for hard disk drives. Various overcoat materials have been developed for use in the manufacture of hard disk drives, including carbon (C), silicon (Si), and zirconium (Zr)-based materials. Of these, carbon-based overcoats have become widely utilized as a standard protective material in the hard disk industry. Various types of carbon-based overcoats, with and without various dopants, such as hydrogen (H), nitrogen (N), fluorine (F), and $N_xH_y$, and various deposition methods, such as ion beam deposition, chemical vapor deposition (CVD), cathode sputtering, etc. have been studied for use as protective overcoat materials.

When used in disk-type media employed in CSS type operation, the overcoat typically protects the magnetic thin-film layer at its inner diameter landing zone from damage when the data transducer head contacts the disk during a start-stop cycle, whereas, in the outer diameter data zone of the disk, the overcoat functions to protect the disk from environmental factors, such as oxidation or humidity, that can lead to corrosion and/or degradation of film properties. The tribological performance of disk-type media in CSS operation is highly dependent upon the thickness of the protective overcoat, e.g., of carbon or carbon-based material. In general, thicker carbon-based overcoats exhibit better tribological performance than thinner overcoats. However, an increase in the thickness of the overcoat results in a concomitant increase in the spacing, or flying height, of the magnetic head or other type data transducer, over the surface of the magnetic medium, which, inter alia, limits the recording density and degrades performance parameters such as, for example, signal-to-noise ratio (SNR).

In view of the above, and since the most tribologically critical portion of the surface area of disk-shaped magnetic recording media is the CSS (i.e., head landing) zone and the most critical portion for recording performance is the data zone, which zones have different overcoat layer thickness requirements, multi-zone protective overcoats have been proposed. One such zone design or concept utilizes a relatively thick protective overcoat (e.g., carbon-based) on the CSS zone to provide more robust tribological performance and a relatively thin carbon-based overcoat on the data zone to ensure a smaller spacing loss (e.g., SNR loss) between the transducer head and the magnetic media in order to achieve better performance.

Figure 1:
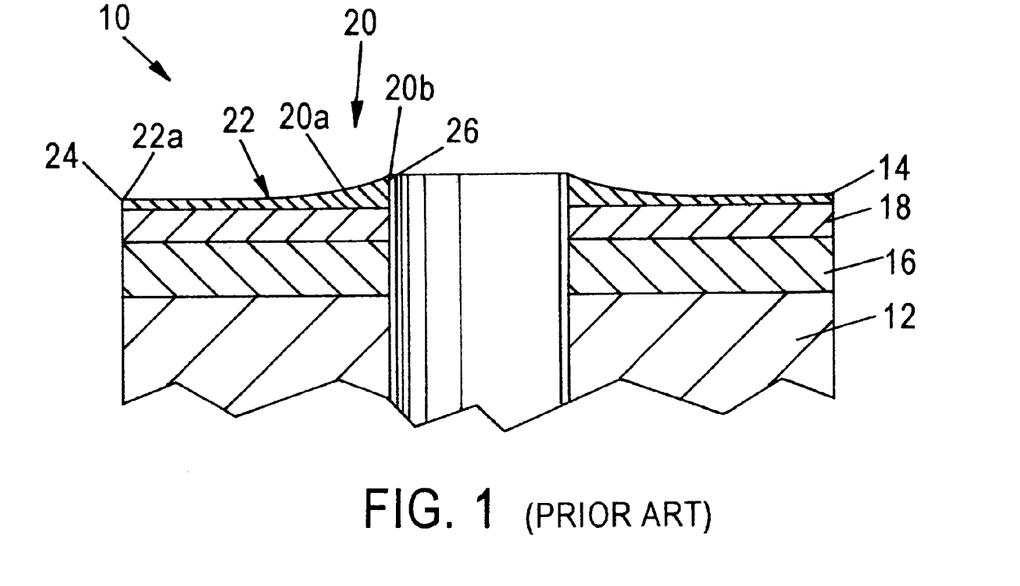
FIG. 1 is a cross-sectional schematic view of a magnetic disk having a thickness gradient protective overcoat layer according to the Prior Art.

FIG. 1 shows, in cross-sectional schematic view, a magnetic recording disk 10 composed of a base or substrate 12 and incorporating a multi-zone protective overcoat 14 as described above. Disk 10 also includes an under-layer 16 formed directly on the substrate and a magnetic thin film layer 18 formed on the under-layer. Disk 10 further comprises an inner diameter CSS (or landing) zone 20, where, as described above, the transducer head contacts the disk surface during a start-stop cycle. An outer, data zone 22 extends from the outer edge 20a of the landing zone to the outer diameter 24 of substrate 12. According to the multi-zone concept, protective overcoat 14 which extends between the annular inner diameter region 20b of the CSS zone to the outer edge 22a of the data zone, has a greater thickness in the CSS zone 20 than in the data zone 22. Typically, the thickness of the overcoat 14 in the CSS zone 20 is 2–3 times the thickness of the overcoat 14 in the data zone 22.

For magnetic media, the substrate 12 may comprise aluminum (Al), textured if desired and plated with a selected alloy, e.g., nickel-phosphorus (NiP), to achieve a requisite surface hardness. Alternatively, substrate 12 may comprise glass, ceramic, or glass-ceramic composite materials, similarly textured if desired. Conventionally-sized substrates for use in typical magnetic hard disk drives have outer diameters 24 of 130 mm (5.25 in.), 95 mm (3.5 in.), and 65 mm (2.5 in.), with corresponding inner diameters 26 of 40 mm (1.57 in.), 25 mm (0.98 in.), and 20 or 25 mm (0.79 or 0.98 in.).

Under-layer 16 is preferably comprised of sputtered chromium (Cr) or a Cr-based alloy, and the magnetic film layer 18 typically comprises a cobalt (Co)-based alloy, including binary, ternary, quaternary, and five-membered alloys. The protective overcoat 14 is comprised of a material imparting good tribological, i.e., wear-resistant, protective properties to the medium 10 and is typically composed of carbon (C), zirconium oxide ($ZrO_2$), silicon (Si), silicon carbide (SiC), or silicon oxide ($SiO_2$).

Figure 2:
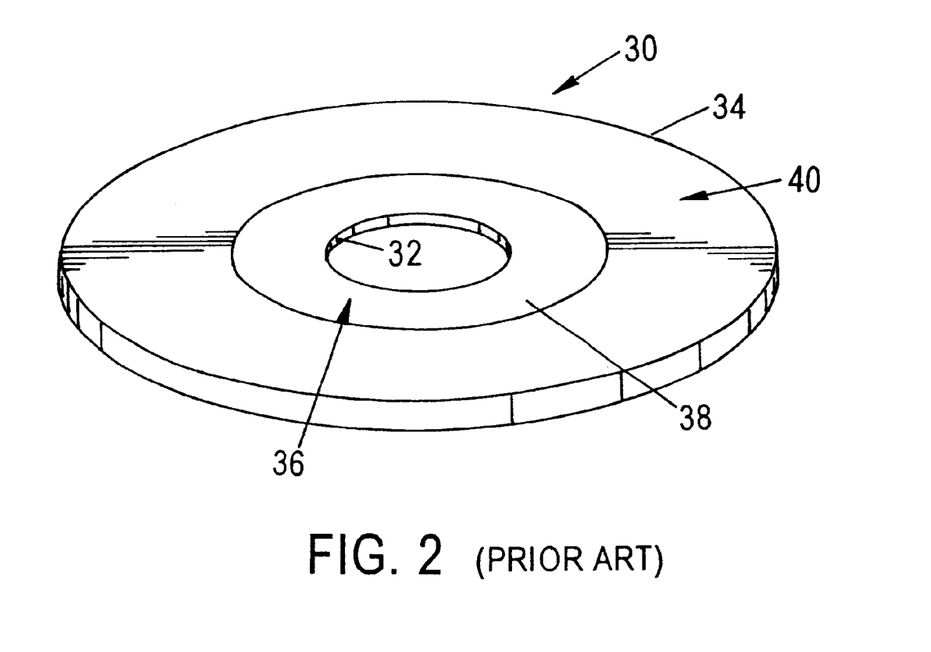
FIG. 2 is a perspective view of a magnetic disk as in FIG. 1 for illustrating the CSS (landing) and data zones thereof.

Referring now to FIG. 2, shown therein, in perspective view, is a magnetic recording disk 30 having a CSS (landing) zone 36 and a data zone 40. More specifically, FIG. 2 illustrates an annularly-shaped magnetic recording disk 30 of the type having a protective overcoat thereon as shown in FIG. 1. Annularly-shaped disk 30 includes an inner diameter 32 and an outer diameter 34. Adjacent to the inner diameter 32 is an annularly-shaped, inner diameter CSS (landing) zone 36. When the disk 30 is operated in conjunction with a magnetic transducer head (not shown), the CSS zone 36 is the region where the head makes contact with the disk during start-stop cycles or other intermittent occurrences. In FIG. 2, the edge of the CSS zone 36 is indicated by line 38, which is the boundary between the landing zone 36 and a data zone 40, where magnetic information is stored in the magnetic recording layer of the disk.

As best illustrated in FIG. 1, the thickness transition of the protective overcoat 14 between the thinner and thicker data and CSS zones 22 and 20, respectively, is gradual. In practice, however, such gradual transition of protective overcoat thickness is not particularly useful or satisfactory because full advantage cannot be taken of the relatively thick protective overcoat over the CSS zone 20 providing robust tribological performance and the thinner protective overcoat providing better data recording performance within the relatively wide transition region which includes a significant portion of the width of the data zone 22.

Accordingly, there exists a need for improved means and methodology for forming, as by sputtering techniques, single- and dual-sided magnetic information storage and read-out disks, which means and methodology, provide rapid, simple, and reliable formation of multi-zone protective overcoat layers thereon with abrupt (i.e., narrow) transition zones between thinner and thicker portions respectively formed on data and CSS zones of the disks.

The present invention addresses and solves the problems attendant upon the manufacture of high recording density magnetic media with multi-zone protective overcoats having highly delineated thickness variation between data recording and CSS (landing) zones, while maintaining full compatibility with all aspects of conventional automated disk manufacture technology. Further, the means and methodology provided by the present invention enjoy diverse utility in the manufacture of devices requiring thin film coatings having a gradation in thickness and properties dependent thereon, including, inter alia, optical coatings for various applications where the optical properties (e.g., optical density, reflectance, transmittance, absorptance, scattering, etc.) must be varied in a selected (e.g., radial) direction, and coatings for selectively modifying the physical and/or chemical properties of a surface in a selected (e.g., radial) direction for providing a desired property, e.g., anti-friction, corrosion prevention, hardness, roughness, etc.

DISCLOSURE OF THE INVENTION

An advantage of the present invention is an improved apparatus for forming on a selected portion of a substrate surface a sputtered deposit having defined inner and outer peripheries.

A further advantage of the present invention is an improved sputtering apparatus including a target assembly for forming an annularly-shaped deposited layer having sharply defined inner and outer peripheries.

A still further advantage of the present invention is an improved sputtering target assembly useful in the manufacture of disk-shaped magnetic recording media.

Yet another advantage of the present invention is an improved method of sputter depositing a layer of a material on a selected portion of a substrate surface, the layer having well-defined inner and outer peripheries.

Still another advantage of the present invention is an improved method of sputter depositing on a substrate surface a layer having thinner and thicker portions, with a narrow transition zone therebetween.

A yet further advantage of the present invention is an improved method for sputter depositing a multi-thickness zone protective overcoat layer on a surface of a disk-shaped magnetic information storage medium.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to one aspect of the present invention, the foregoing and other advantages are obtained in part by an apparatus for forming on a selected portion of a substrate surface a sputtered deposit having defined inner and outer peripheries, the apparatus including a target assembly comprising:

(a) a target assembly comprised of a material to be sputtered and having a planar sputtering surface including an erosion track area;

(b) a collimating shield positioned proximate to the sputtering surface and surrounding at least a portion of the erosion track area, the collimating shield comprising an inwardly facing wall defining an interior space and extending for a first length in the direction away from the erosion track area; and (c) a blocking shield centrally positioned within the interior space and overlying a central portion of the erosion track area, the blocking shield comprising an outwardly facing wall extending for a second length in the direction away from the erosion track area and forming an open-ended collimating channel for sputtered species between the inwardly and outwardly facing walls, the walls defining the inner and outer peripheries of the sputtered deposit, wherein:

i. the collimating shield (b) defines the size of the outer periphery of the deposit and the first length thereof is sufficient to block deposition of high incident angle sputtered species;

ii. the blocking shield (c) defines the inner periphery of the deposit and the second length thereof is sufficient to further block deposition of high incident angle sputtered species traveling across the collimating channel from the portion of the erosion track area adjacent the inwardly facing wall of the collimating shield (b); and    iii. the combination of the collimating shield (b) and the blocking shield (c) minimizes the width of a transition zone between regions of different sputtered deposit thickness.

According to particular embodiments of the present invention, the apparatus further comprises substrate mounting means (d) for positioning a substrate surface adjacent to the open end of the collimating channel; target (a) forms part of a planar magnetron cathode; the collimating shield (b) and the blocking shield (c) are circularly-shaped and concentric, whereby the open-ended collimating channel for sputtered species is annularly-shaped.

According to further embodiments of the present invention, the target (a) further comprises an annularly-shaped erosion track area which includes a central axis extending perpendicularly thereto; the collimating shield (b) and the blocking shield (c) are coaxial with the central axis, and the collimating shield (a) surrounds the annularly-shaped erosion track at the circumference thereof; the blocking shield (c) is affixed to the erosion track area of the target sputtering surface at the central axis thereof and the second distance thereof is equal to or less than the first distance of the collimating shield (b).

According to a still further embodiment of the present invention, the substrate mounting means (d) comprises means for mounting a disk-shaped substrate adjacent the open end of the channel.

According to another aspect of the present invention, a method of sputter depositing a layer of a material on a selected portion of a surface of a substrate is provided, wherein the layer has defined inner and outer peripheries, the method comprising the sequential steps of:

(a) providing a substrate comprising a deposition surface; and (b) sputter depositing the layer of the material on the selected portion of the deposition surface of the substrate, wherein the selective sputter depositing comprises:

i. providing a target comprised of the material and including a planar sputtering surface having an erosion track area;

ii. positioning a collimating shield proximate to the sputtering surface of the target and surrounding at least a portion of the erosion track area, the collimating shield comprising an inwardly facing wall defining an interior space and extending for a first length in the direction away from the erosion track area;

iii. centrally positioning a blocking shield within the interior space and overlying a central portion of the erosion track, the blocking shield comprising an outwardly facing wall extending for a second length in the direction away from the erosion track area and forming an open-ended collimating channel for sputtered species between the inwardly and outwardly facing walls; and iv. positioning the selected portion of the substrate deposition surface adjacent the open end of the channel for receiving sputtered species exiting therefrom, wherein:

the inwardly facing wall of the collimating shield defines the outer periphery and the first length thereof is sufficient to block deposition of high incident angle sputtered species;

the outwardly facing wall of the blocking shield defines the inner periphery of the deposit and the second length thereof is sufficient to further block deposition of high incident angle sputtered species traveling across the collimating channel from the portion of the erosion track area adjacent the inwardly facing wall of the collimating shield; and the combination of the collimating shield and the blocking shield minimizes the width of a transition zone between regions of different sputtered deposit thickness.

According to a particular embodiment of the present invention, step (a) comprises providing as the substrate a substrate having thereon a uniform thickness first layer of the material and constituting the deposition surface, whereby the selective depositing step (b) forms a second layer of the material, the combination of the first and second layers forming adjacent relatively thick and relatively thin portions with a narrow thickness gradient or transition zone therebetween.

According to further embodiments of the present invention, step (a) comprises providing a disk-shaped substrate and step (b) comprises providing circularly-shaped, concentric collimating and blocking shields, whereby the open-ended collimating channel for sputtered species is annularly-shaped and the second layer of material deposited on the predetermined portion of the deposition surface of the substrate is annularly-shaped with inner and outer peripheries determined by the corresponding outwardly and inwardly facing walls of the collimating channel.

According to still further embodiments of the present invention, step (a) comprises providing a disk-shaped substrate comprising a magnetic data and information storage/retrieval medium having inner and outer peripheries and sputter depositing the first, uniform thickness layer of the material over the entire deposition surface; and step (b) comprises selectively sputter depositing the second layer of the material over a contact start/stop (CSS) zone of the disk-shaped substrate, e.g., adjacent the inner periphery of the disk-shaped substrate.

According to specific embodiments of the present invention, steps (a) and (b) each comprise depositing a layer of a protective overcoat material for improving tribological performance of the magnetic medium, wherein steps (a) and (b) each comprise sputtering a target comprising a material selected from carbon (C), zirconium oxide ($ZrO_2$), silicon (Si), silicon carbide (SiC), and silicon oxide ($SiO_2$).

According to more specific embodiments of the present invention, steps (a) and (b) each comprise sputtering a target material comprising carbon (C) and depositing a layer of carbon (C) doped or chemically reacted with hydrogen (H), nitrogen (N), fluorine (F), or $N_xH_y$, the first and second layers are each up to about 60 Å thick, and the width of the thickness transition or gradient zone between the relatively thin and relatively thick portions of the layer of protective overcoat material is less than about 25 mils.

According to yet another aspect of the present invention, an apparatus is provided which comprises:

a sputtering target; and means for selectively depositing material sputtered from the target onto an annularly-shaped portion of a substrate surface.

Additional advantages and features of the present invention will become readily apparent to those skilled in the art from the following detailed description, wherein only preferred embodiments of the invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, wherein.

DESCRIPTION OF THE INVENTION

The present invention is based upon the discovery that a sputtering target assembly incorporating three key features, i.e., (1) a sputtering target/cathode having a well-defined or confined erosion track, (2) a peripheral collimating shield, and (3) a centrally positioned blocking pin or shield, can be utilized for depositing a coating material layer on a preselected portion of a substrate deposition surface in a well-defined manner. Moreover, when the substrate deposition surface includes a previously deposited uniform thickness layer of the same deposition material, multi-thickness zone layers can be obtained wherein the thickness transition zone between thinner and thicker layer portions is extremely narrow, e.g., on the order of 25 mils or less. The invention thus finds particular utility in the manufacture of disk-shaped magnetic data or information recording/retrieval media, wherein it is desired to form a relatively thick protective overcoat layer in an inner, annularly-shaped portion thereof, i.e., a contact stop/start (CSS) or landing zone, and a relatively thinner overcoat layer in a radially outwardly extending annularly-shaped portion, i.e., a data zone, with a very narrow thickness transition (or gradient) zone between the thinner and thicker portions.

According to the present invention, the sputtering target/cathode (1) typically comprises a planar magnetron type magnet assembly for providing a well-defined erosion track area having a minimum size or width (e.g., diameter) as is required for selective deposition on a substrate of given area, whereby advantages of high deposition rate and direct impingement of sputtered species onto the substrate are obtained. The inwardly facing wall of the peripheral collimating shield (2) defines the outer periphery or dimension (e.g., diameter) of the selective deposit and blocks deposition of high incident angle sputtered species, thereby reducing the width of the transition zone at the outer periphery. In addition, when electrically grounded, the collimating shield confines the plasma to the interior space within the walls of the shield, whereby sputter deposition is confined within a narrow dimension even if the erosion track of the target is wider than the area of selective depositing, e.g., the CSS zone of a magnetic disk substrate. Moreover, the spacing between the distal (i.e., open) end of the collimating shield and the substrate also affects the width of the transition zone: the closer the collimating shield is to the substrate, the narrower is the transition zone. The centrally positioned blocking shield (3) serves to further minimize the transition zone by reducing deposition of sputtered species traveling at high incident angles from the outer diameter of the erosion track of the target/cathode towards the substrate surface across the space between the collimating and blocking shields; i.e., the outwardly facing wall of the blocking shield forms, in concert with the inwardly facing wall of the collimating shield, a collimating channel for sputtered species and, in addition, defines the inner periphery of the sputtered deposit.

Figure 3:
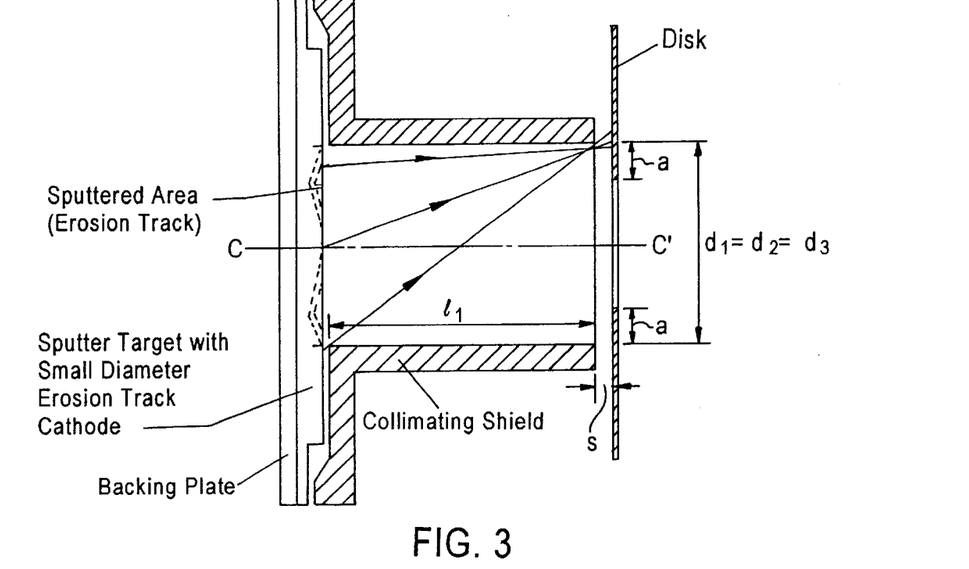
FIG. 3 is a simplified, cross-sectional schematic view of part of a target assembly, for facilitating an understanding of the operating principles of target assemblies according to the present invention.

Referring now to FIG. 3, shown therein, simply by way of illustration but not limitation, and for facilitating a better understanding of the principles of the present invention, is a schematic, cross-sectional view of part of a sputtering target assembly of generally circular configuration, as would be utilized in magnetic disk manufacture for selective sputter deposition on annularly-shaped zones or portions of the disk, e.g., CSS zones. It should be recognized that the principles and instrumentalities of the present invention are equally applicable for selective sputter deposition of a variety of different materials onto a number of differently shaped substrate zones or areas by suitable choice of shape or configuration of the sputtering target and target material, collimator shield, and central blocking shield. For example, given the present disclosure and objectives of the invention, the artisan may readily utilize the principles of the present invention to form square, rectangular, triangular, or other frame-shaped sputtered deposits for use in a particular application.

As illustrated in FIG. 3, the sputtering target assembly is generally circularly-shaped and radially symmetric about longitudinally extending axis c-c' and includes a target (or sputtering) surface comprised of a material to be selectively sputtered onto an inner, annularly-shaped portion a of a magnetic disk substrate, which portion a forms the CSS zone of the disk. The target material is bonded at its rear side to a backing plate, and in typical sputter deposition applications, a magnetron magnet assembly of conventional design (not shown for illustrative simplicity) is located behind the rear surface of the backing plate for generating a localized magnetic field at the sputtering surface. In instances where the magnet assembly is rotatable about central axis c-c' perpendicular to the target surface, the particular shape of the magnetron magnet assembly is not critical, in which case magnetron magnet shapes usable in the present invention include, inter alia, circularly- and oval-shaped (i.e., "racetrack") types. However, when the magnet assembly is non-rotatable, a circularly-shaped magnet assembly would be required in the illustrated embodiment because the magnet assembly defines the outer diameter of the erosion track, which must be equal to or less than the outer diameter of the collimating shield.

The sputter target/cathode is electrically negatively biased by means of a power supply (not shown in the drawing for illustrative simplicity) for generating an intense plasma at the target sputtering surface under low pressure conditions. The magnetron plasma discharge provides a high rate of target sputtering due to bombardment of the target surface by ionized species formed within the plasma and accelerated by the electric field at the target/cathode. Magnetron-type target/cathodes experience intense sputtering within a narrow erosion track area determined by the magnetron magnet size and shape, and thus high rates of sputter deposition are obtainable. Positioned in surrounding, but closely spaced apart relation to the sputtering surface area (i.e., the erosion track), is a collimating shield generally in the form of a "top hat" comprising a hollow cylinder having inwardly facing wall surfaces which extend away from the sputtering surface area (erosion track) for a length $I_1$ and a flange portion extending parallel to the target surface. The collimating shield is electrically isolated from the target/cathode and may be connected to electrical ground potential, in which case the plasma is further confined to the interior space defined by the inner wall surface of the shield.

In the illustrated case, the inner diameter $d_1$ of the collimating shield, the outer diameter $d_2$ of the annularly-shaped erosion track, and the outer diameter $d_3$ of the annularly-shaped CSS zone of the disk are substantially equal. The length $I_1$ of the collimating shield is selected, in relation to the target erosion track diameter $d_2$, to be sufficient to provide adequate collimation of the particles sputtered from within the erosion track area of the target sputtering surface. More specifically, as is indicated by the various trajectories of sputtered particles shown in the figure, deposition of high incident angle sputtered species at the outer peripheral boundary of annular area a of the disk substrate can be effectively and substantially blocked by use of a collimating shield of sufficient length $I_1$ and appropriate inner diameter $d_1$, together with placement of the disk surface at a correspondingly appropriately small spacing s from the distal end of the collimating shield. As a consequence, the transition width between the selectively sputter deposited, annularly-shaped inner zone and the shielded outer zone can be minimized. Given the present disclosure and objectives of the present invention, it is considered within the scope of ordinary skill to determine and/or optimize the various target, magnet, and shield parameters, dimensions, and spacings for use in a given application.

Figure 4:
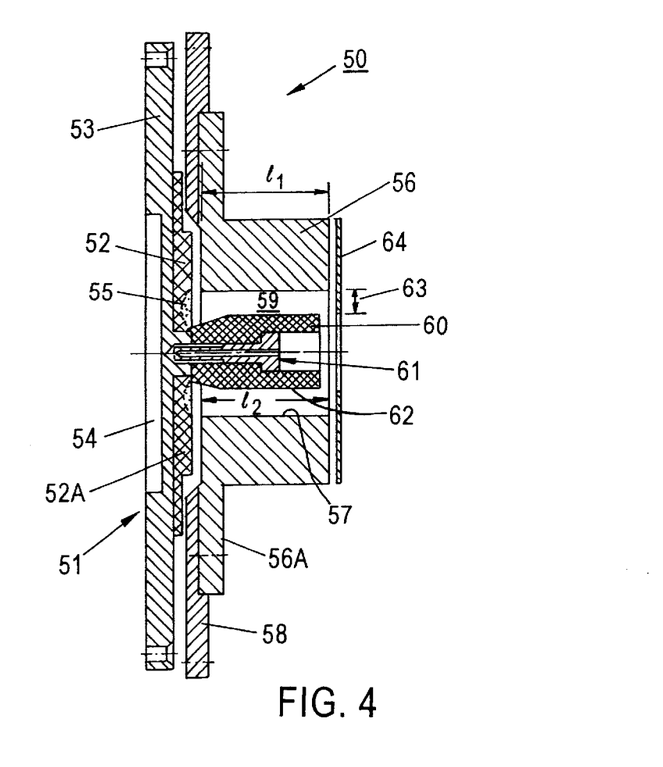
FIG. 4 is a simplified, cross-sectional view of a target assembly according to an embodiment of the present invention.

Referring now to FIG. 4, shown therein, in schematic cross-sectional view is a generally circularly-configured sputtering target assembly 50 according to an embodiment of the present invention. As illustrated, the target/cathode 51 comprises an annularly-shaped sputtering target material 52 bonded to a backing plate 53 having a recess 54 in a central portion of the rearward facing surface thereof for accommodating a magnetron magnet assembly (e.g., of annular configuration) therein for forming an annularly-shaped erosion track area 55 in a portion of the target surface 52A. Positioned in closely spaced relation to the target surface 52A and surrounding the outer diameter or periphery of the erosion track area 55 is a generally "top hat"-shaped collimating shield 56 having an inwardly facing wall surface 57 of diameter substantially equal to the outer diameter of the erosion track area 55 and extending for a length $I_1$ away from the target surface 52A. Shield extension 58 (e.g., of aluminum) is popsitioned between flange portion 56A of the collimating shield and the target/chathode 51 and facilitates mounting of the collimating shield. As before, the collimating shield is connected to electrical ground for confirming the plasma to the interior space defined by inner wall surface 57. Inasmuch as the target/cathode 51 and collimating shield 56 are electrically isolated, discharge between the two members does not occur since their spacing is less than dark space at typical process pressures.

Centrally positioned within the interior space is a generally cylindrically-shaped blocking shield 60 having a predetermined diameter and formed of the same material as that of the target 52, e.g., carbon, aligned with the central axis of the target/cathode 51 and affixed thereto by means of fastener 61. Blocking shield 60 extends from the surface of the target/cathode 51 central portion for a length $I_2$ substantially equal to or slightly less than length $I_1$ of the collimating shield 56. The combination of concentric collimating shield 56 and central blocking shield 60, each of preselected diameter, results in the formation of an annularly-shaped, open-ended collimating channel 59 defined by the inwardly facing wall 57 of the collimating shield 56 and outwardly facing wall 62 of the central blocking shield 60, which collimating channel functions as a conduit for low incident angle sputtered particles traveling from the erosion track area 55 to the inner, annularly-shaped CSS zone 63 of magnetic disk substrate 64. As should be apparent from FIGS. 3 and 4, the centrally positioned cylindrical blocking shield 60 further prevents deposition of high incident angle sputtered species within the transition zone, thereby allowing selective formation of a sputtered deposit (e.g., on a CSS zone) having an extremely well-defined peripheral boundary and a minimized transition zone.

EXAMPLE

Figure 5:
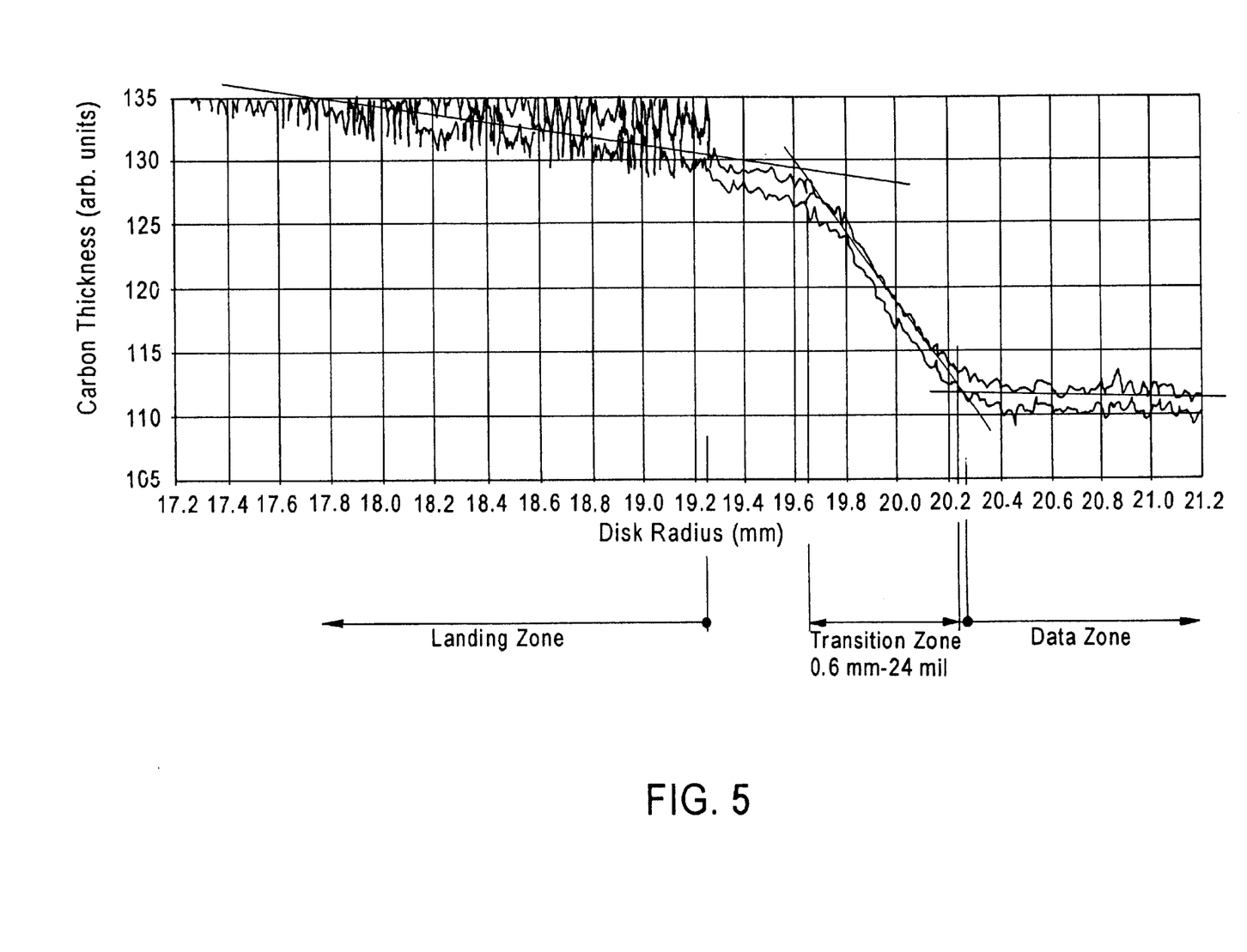
FIG. 5 is a graph illustrating the narrow transition zone between thinner and thicker protective overcoat portions for magnetic disk media obtainable by use of the inventive target assemblies.

A multi-thickness zone carbon-based protective overcoat having a very sharp (i.e., narrow) transition zone (less than about 25 mils, in the radial direction) was formed on a magnetic disk substrate by sputter depositing the overcoat in multiple deposition chambers. A uniform thickness C:H overcoat (60 Å thick) was first deposited over the entire disk surface in a first sputter deposition chamber. A second sputter deposition chamber equipped with a collimated sputtering target assembly substantially as described above with reference to the embodiment shown in FIG. 2 was utilized for selectively depositing an additional 60 Å of C:H only over the inner, annularly-shaped CSS zone. As may be apparent from the graph of FIG. 5 showing the thickness profile of the C:H overcoat obtained by such two-step deposition, the transition zone between the greater thickness, annularly-shaped inner CSS zone and the thinner, radially outward, annularly-shaped data zone is less than about 24 mils., whereby optimum tribological as well as parametric performance of the disk was obtained.

Thus, the present invention advantageously provides an apparatus and method for forming sputtered deposits or layers on selected portions of a substrate surface. The invention enjoys particular utility in the manufacture of disk-shaped magnetic data or information storage/read-out medium requiring deposition of a thicker protective overcoat in a CSS zone for optimum tribological performance and a thinner protective overcoat in a data zone for optimum parametric performance. In addition, the inventive apparatus and methodology are fully compatible with the requirements of automated, high-throughput magnetic disk manufacture.

In addition to the above-described utility in the manufacture of disk-shaped recording/information retrieval media requiring selective deposition of annularly-shaped areas, the invention is applicable to selective deposition on a wide variety of area shapes and configurations by use of appropriately shaped sputtering targets, collimating shields, and blocking shields. Further, the type of coatings deposited by the inventive apparatus and methodology is not limited to the specifically disclosed protective overcoats for recording media. Rather, the invention is broadly applicable to the deposition of various types of optical coatings as may be required in particular applications, wherein optical properties such as optical density, spectral or integral reflectance, spectral or integral transmittance, absorptance, scattering, etc., must be varied in e.g., a radial direction. The invention is also applicable to the formation of coatings which modify the physical and/or chemical properties of a substrate surface in, e.g., a radial direction, such as for providing a desired anti-friction, corrosion prevention, hardness, roughness. etc., characteristic to a particular surface portion.

In the previous description, numerous specific details are set forth, such as specific material, structures, reactants, processes, etc., in order to provide a better understanding of the present invention. However, the present invention can be practiced without resorting to the details specifically set forth. In other instances, well-known processing materials and techniques have not been described in order to unnecessarily obscure the present invention.

Only the preferred embodiments of the present invention and but a few examples of its versatility are shown and described in the present disclosure. It is to be understood that the present invention is capable of use in various other combinations and environments and is susceptible of changes and/or modifications within the scope of the inventive concept as expressed herein.

What is claimed is:

1. An apparatus for forming on a selected portion of a substrate a sputtered deposit having defined inner and outer peripheries, the apparatus including a target assembly comprising:

(a) a target comprised of a material to be sputtered and having a planar sputtering surface including an erosion track area;

(b) a collimating shield positioned proximate to said sputtering surface and surrounding at least a portion of said erosion track area, said collimating shield comprising an inwardly facing wall defining an interior space and extending for a first length in a direction away from said erosion track area; and (c) a blocking shield centrally positioned within said interior space and overlying a central portion of said erosion track area, said blocking shield comprising an outwardly facing wall extending for a second length in the direction away from said erosion track area and forming an open-ended collimating channel for sputtered species between said inwardly and outwardly facing walls, said wall defining said inner and outer peripheries of the sputtered deposit, wherein i. the collimating shield (b) defines the outer periphery of the deposit and said first length thereof is sufficient to block deposition of high incident angle sputtered species;

ii. the blocking shield (c) defines the inner periphery of the deposit and said second length thereof is sufficient to further block deposition of high incident angle sputtered species traveling across the collimating channel from the portion of the erosion track area adjacent the inwardly facing wall of the collimating shield (b); and iii. the combination of the collimating shield (b) and blocking shield (c) minimize the width of a transition zone between regions of different sputtered deposit thickness.

2. The apparatus as in claim 1, further comprising:

(d) substrate mounting means for positioning said substrate surface adjacent said open end of said channel.

3. The apparatus as in claim 1, wherein:

target (a) forms part of a planar magnetron cathode.

4. The apparatus as in claim 1, wherein:

said collimating shield (b) and said blocking shield (c) are circularly-shaped and concentric, and said open-ended channel for sputtered species is annularly-shaped.

5. The apparatus as in claim 4, wherein:

said target (a) comprises an annularly-shaped, planar erosion track area which includes a central axis extending perpendicularly thereto; and said collimating shield (b) and said blocking shield (c) are coaxial with said central axis.

6. The apparatus as in claim 5, wherein:

said collimating shield (b) surrounds said annularly-shaped erosion track area at the circumference thereof.

7. The apparatus as in claim 5, wherein:

said blocking shield (c) is affixed to said erosion track area of said target sputtering surface at the central axis thereof and said second length of said blocking shield is equal to or less than said first length of said collimating shield (b).

8. The apparatus as in claim 4, further comprising:

(d) substrate mounting means for mounting the surface of a disc-shaped substrate adjacent said open end of said channel.

9. A method of sputter depositing a layer of a material on a selected portion of a substrate surface, the layer having defined inner and outer peripheries, the method comprising the sequential steps:

(a) providing a substrate comprising a deposition surface; and (b) sputter depositing said layer of said material on the selected portion of said deposition surface of said substrate, wherein said selective sputter depositing comprises:

i. providing a target comprised of said material and including a planar sputter surface having an erosion track area;

ii. positioning a collimating shield proximate to said sputtering surface of said target and surrounding at least a portion of the erosion track area, the collimating shield comprising an inwardly facing wall defining an interior space and extending for a first length in a direction away from said erosion track area;

iii. centrally positioning a blocking shield within said interior space and overlying a central portion of said erosion track, said blocking shield comprising an outwardly facing wall extending for a second length in the direction away from said erosion track area and forming an open-ended collimating channel for sputter species between said inwardly and outwardly facing walls; and iv. positioning said selected portion of said deposition surface of said substrate adjacent said open end of said channel for receiving sputtered species exiting therefrom, wherein:

said inwardly facing wall of said collimating shield defines said outer periphery and said first length thereof is sufficient to block deposition of high incident angle sputtered species;

said outwardly facing wall of said blocking shield defines said inner periphery and said second length thereof is sufficient to further block deposition of high incident angle sputtered species traveling across said collimating channel from the portion of said erosion track area adjacent said inwardly facing wall of said collimating shield, and the combination of said collimating shield and said blocking shield minimizes the width of a transition zone between different sputtered deposit thickness.

10. The method as in claim 9, wherein:

step (a) comprises providing as said substrate a substrate having thereon a uniform thickness first layer of said material and constituting said deposition surface; whereby said selective depositing step (b) forms a second layer of said material, the combination of said first and second layers forming adjacent thick and thin portions with a narrow thickness transition zone therebetween.

11. The method as in claim 10, wherein:

step (a) comprises providing a disk-shaped substrate; and step (b) comprises providing circularly-shaped, concentric collimating and blocking shields; whereby said open-ended collimating channel for sputtered species is annularly-shaped and said second layer of said material deposited on said selected portion of said deposition surface of said substrate is annularly-shaped with inner and outer peripheries determined by the corresponding outwardly and inwardly facing walls of said collimating channel.

12. The method as in claim 11, wherein:

step (a) further comprises providing a disk-shaped substrate comprising a magnetic data or information recording/storage/read-out medium having inner and outer peripheries and sputter depositing said first, uniform thickness layer of said material over the entire substrate deposition surface; and step (b) comprises selectively sputter depositing said second layer of said material over a contact start/stop (CSS) zone of said disk-shaped substrate.

13. The method as in claim 12, wherein:

step (b) comprises selectively sputter depositing said second layer of said material in a CSS zone located adjacent said inner periphery of said disk-shaped substrate.

14. The method as in claim 13, wherein:

steps (a) and (b) each comprise depositing a layer of a protective overcoat material for improving tribological performance of said magnetic medium.

15. The method as in claim 14, wherein:

steps (a) and (b) each comprise sputtering a target comprising a material selected from the group consisting of: carbon (C), zirconium oxide ($ZrO_2$), silicon (Si), silicon carbide (SiC), and silicon oxide ($SiO_2$).

16. The method as in claim 15, wherein:

steps (a) and (b) each comprise sputtering a target material comprising carbon (C).

17. The method as in claim 16, wherein:

steps (a) and (b) each comprise depositing a layer of carbon (C) doped or chemically reacted with hydrogen (H), nitrogen (N), fluorine (F), or NH compounds.

18. The method as in claim 17, wherein:

steps (a) and (b) each comprise depositing a said layer having a thickness of up to about 60 Å.

19. The method as in claim 18, wherein:

the width of said narrow transition zone between said thin and thick portions of said layer of protective overcoat material is less than about 25 mils.

* * * * *